(12) United States Patent
Zhang et al.

(10) Patent No.: US 9,178,153 B2
(45) Date of Patent: Nov. 3, 2015

(54) MEMRISTOR STRUCTURE WITH A DOPANT SOURCE

(75) Inventors: Minxian Max Zhang, Mountain View, CA (US); Jianhua Yang, Palo Alto, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/233,075

(22) PCT Filed: Jul. 20, 2011

(86) PCT No.: PCT/US2011/044734
§ 371 (c)(1),
(2), (4) Date: Jan. 15, 2014

(87) PCT Pub. No.: WO2013/012423
PCT Pub. Date: Jan. 24, 2013

(65) Prior Publication Data
US 2014/0145142 A1    May 29, 2014

(51) Int. Cl.
*H01L 45/00* (2006.01)
*G11C 13/00* (2006.01)

(52) U.S. Cl.
CPC ............ *H01L 45/1658* (2013.01); *H01L 45/04* (2013.01); *H01L 45/08* (2013.01); *H01L 45/085* (2013.01); *H01L 45/142* (2013.01); *H01L 45/145* (2013.01); *H01L 45/146* (2013.01); *H01L 45/147* (2013.01); *G11C 13/0007* (2013.01)

(58) Field of Classification Search
CPC ....... H01L 45/04; H01L 45/08; H01L 45/085; H01L 45/1658; H01L 45/142; H01L 45/145; H01L 45/146; H01L 45/147
See application file for complete search history.

(56) References Cited

U.S. PATENT DOCUMENTS

| | | | |
|---|---|---|---|
| 7,569,459 B2 | 8/2009 | Karg | |
| 7,764,160 B2 | 7/2010 | Kawano | |
| 2005/0195634 A1 | 9/2005 | Ishida et al. | |
| 2007/0120124 A1* | 5/2007 | Chen et al. ...................... | 257/43 |
| 2009/0257271 A1 | 10/2009 | Noshiro | |

(Continued)

FOREIGN PATENT DOCUMENTS

| | | |
|---|---|---|
| CN | 101252170 A | 8/2008 |
| TW | 201010153 A1 | 3/2010 |
| WO | WO-2010085226 | 7/2010 |

OTHER PUBLICATIONS

Meyer, R. et al., Oxide Dual-layer Memory Element for Scalable Non-volatile Cross-point Memory Technology, (Research Paper), 9th Annual Non-Volatile Memory Technology Symposium, 2008, pp. 54-58.

PCT Search Report dated Jul. 16, 2012, PCT Patent Application No. PCT/US2011/044734 filed Jul. 20, 2011, Korean Intellectual Property Office.

*Primary Examiner* — Colleen A Matthews
*Assistant Examiner* — Quovaunda V Jefferson
(74) *Attorney, Agent, or Firm* — Hewlett-Packard Patent Department

(57) ABSTRACT

A memristor including a dopant source is disclosed. The structure includes an electrode, a conductive alloy including a conducting material, a dopant source material, and a dopant, and a switching layer positioned between the electrode and the conductive alloy, wherein the switching layer includes an electronically semiconducting or nominally insulating and weak ionic switching material. A method for fabricating the memristor including a dopant source is also disclosed.

20 Claims, 6 Drawing Sheets

(56) References Cited

U.S. PATENT DOCUMENTS

2010/0117069 A1 5/2010 Sekar
2011/0044089 A1 2/2011 Goux
2011/0073828 A1 3/2011 Xia et al.

* cited by examiner

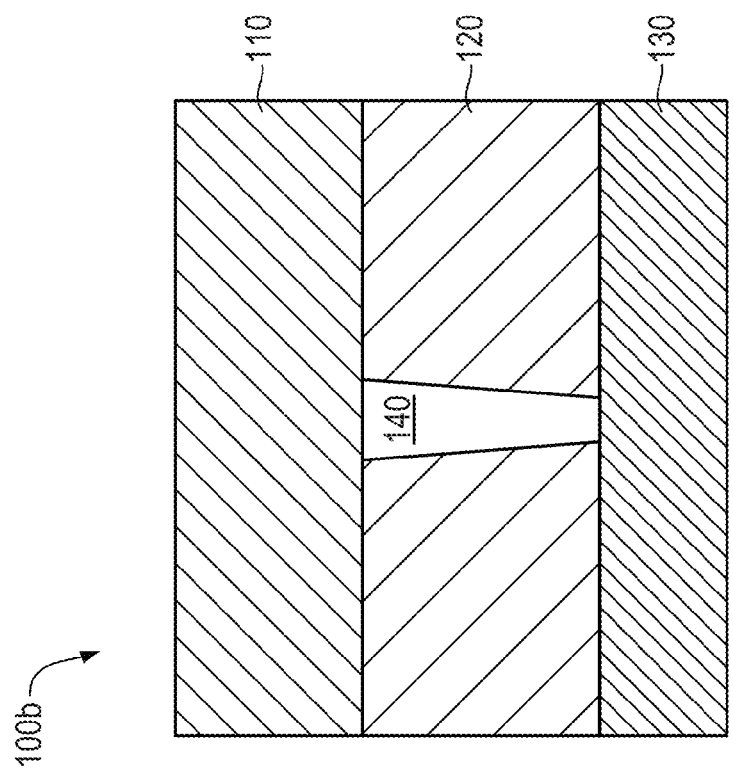
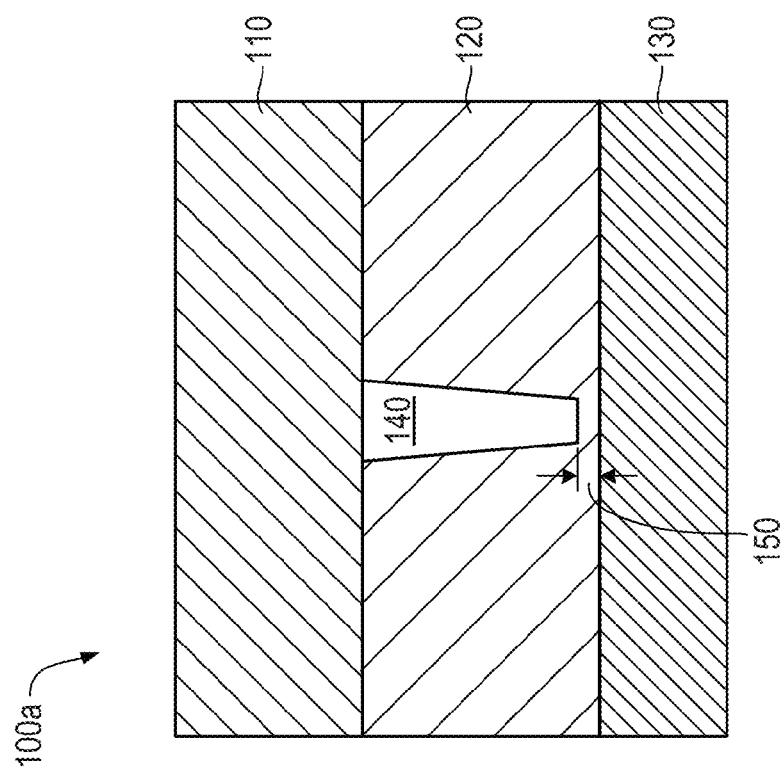

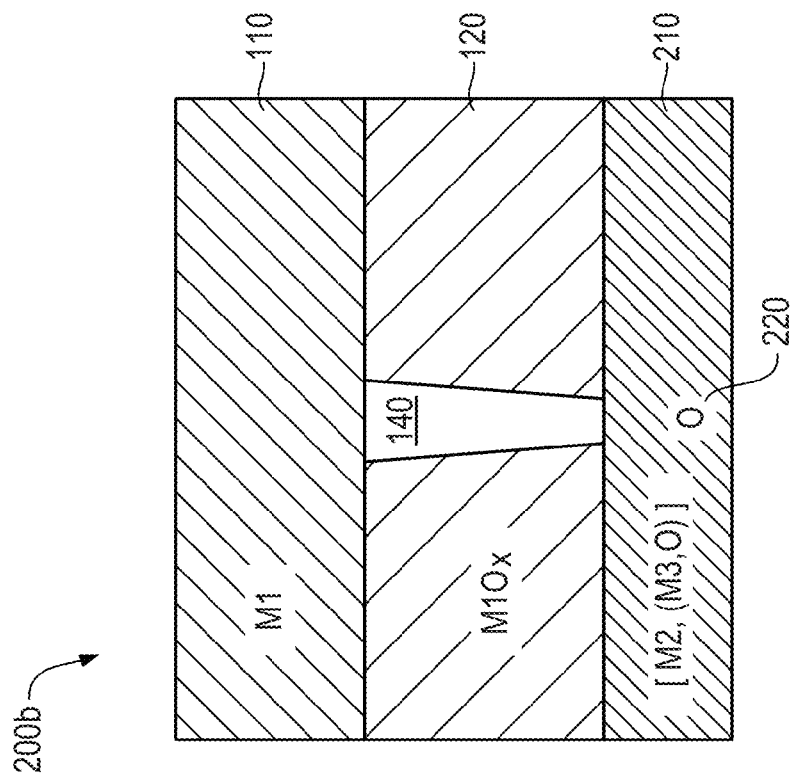
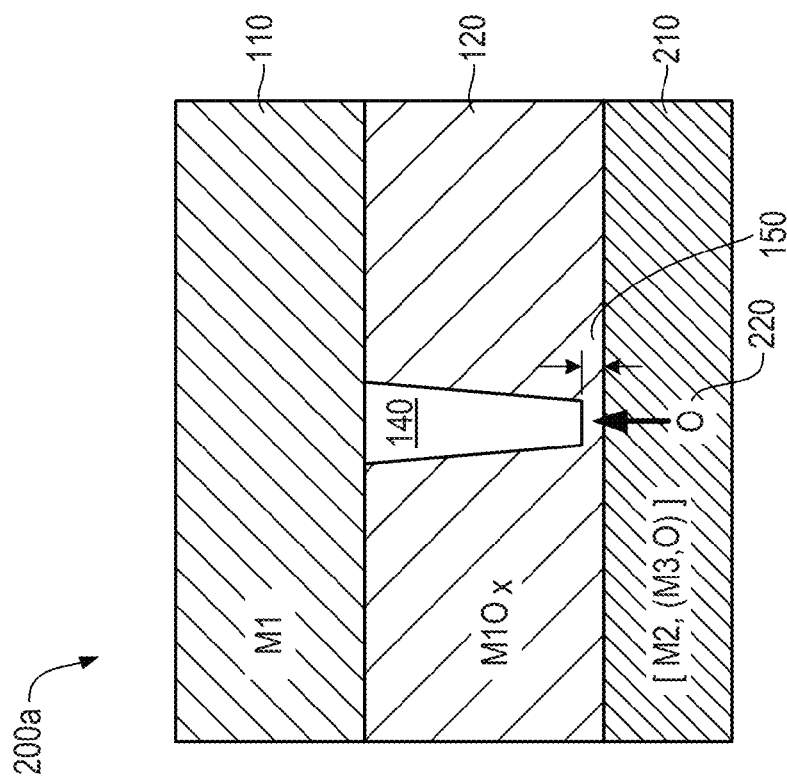
Fig. 2A
Fig. 2B

MEMRISTOR STRUCTURE WITH A DOPANT SOURCE

STATEMENT OF GOVERNMENT INTEREST

This invention has been made with government support. The government has certain rights in the invention.

BACKGROUND

The continuous trend in the development of electronic devices has been to minimize the sizes of the devices and to improve functionalities of the devices. While the current generation of commercial microelectronics are based on submicron design rules, significant research and development efforts are directed towards exploring devices on the nanoscale, with the dimensions of the devices often measured in nanometers or tens of nanometers. In addition to the significant reduction of individual device size and much higher packing density as compared to microscale devices, nanoscale devices may also provide new functionalities due to physical phenomena on the nanoscale that are not observed on the micron scale.

For instance, electronic switching in nanoscale devices using titanium oxide as the switching material has recently been reported. The resistive switching behavior of such a device has been linked to the memristor circuit element theory originally predicted in 1971 by L. O. Chua. The discovery of the memristive behavior in the nanoscale switch has generated significant interest, and there are substantial ongoing research efforts to further develop such nanoscale switches and to implement them in various applications. One of the many important potential applications is to use such a switching device as a memory unit to store digital data.

Memristor switch devices, which are often formed of nanoscale metal/metal oxide/metal layers, employ an "electroforming" process to enable resistive switching. The electroforming process involves a one-time application of a relatively high voltage or current that produces a significant change of electronic conductivity through the metal oxide layer. The electrical switching arises from the coupled motion of electrons and ions within the oxide material. For example, during the electroforming process, oxygen vacancies may be created and drift towards the cathode, forming localized conducting channels in the oxide. Simultaneously, $O^{2-}$ ions drift towards the anode where they evolve $O_2$ gas and cause physical deformation of the junction. The gas eruption often results in physical deformation of the oxide (e.g. bubbles) near the locations where the conducting channels form and delamination between the oxide and the electrode. The conducting channels formed through the electroforming process often have a wide variance of properties depending on how the electroforming process occurred. This variance of properties has relatively limited the adoption of metal oxide switches in computing devices.

In addition, in order to be competitive with CMOS FLASH memories, the emerging resistive switches need to have a switching endurance that exceeds at least millions of switching cycles. Reliable switching channels inside the device may significantly improve the endurance of these switches.

BRIEF DESCRIPTION OF THE DRAWINGS

The detailed description will make reference to the following drawings, in which like reference numerals may correspond to similar, though perhaps not identical, components. For the sake of brevity, reference numerals having a previously described function may or may not be described in connection with other drawings in which they appear.

FIG. 1A is a cross-sectional view of an example memristor without a dopant source in the OFF state.

FIG. 1B is a cross-sectional view of an example memristor without a dopant source in the ON state.

FIG. 2A is a cross-sectional view of an example memristor with an oxygen source in the OFF state in accordance with the examples disclosed herein.

FIG. 2B is a cross-sectional view of an example memristor with an oxygen source in the ON state in accordance with the examples disclosed herein.

DETAILED DESCRIPTION

Figure 3:
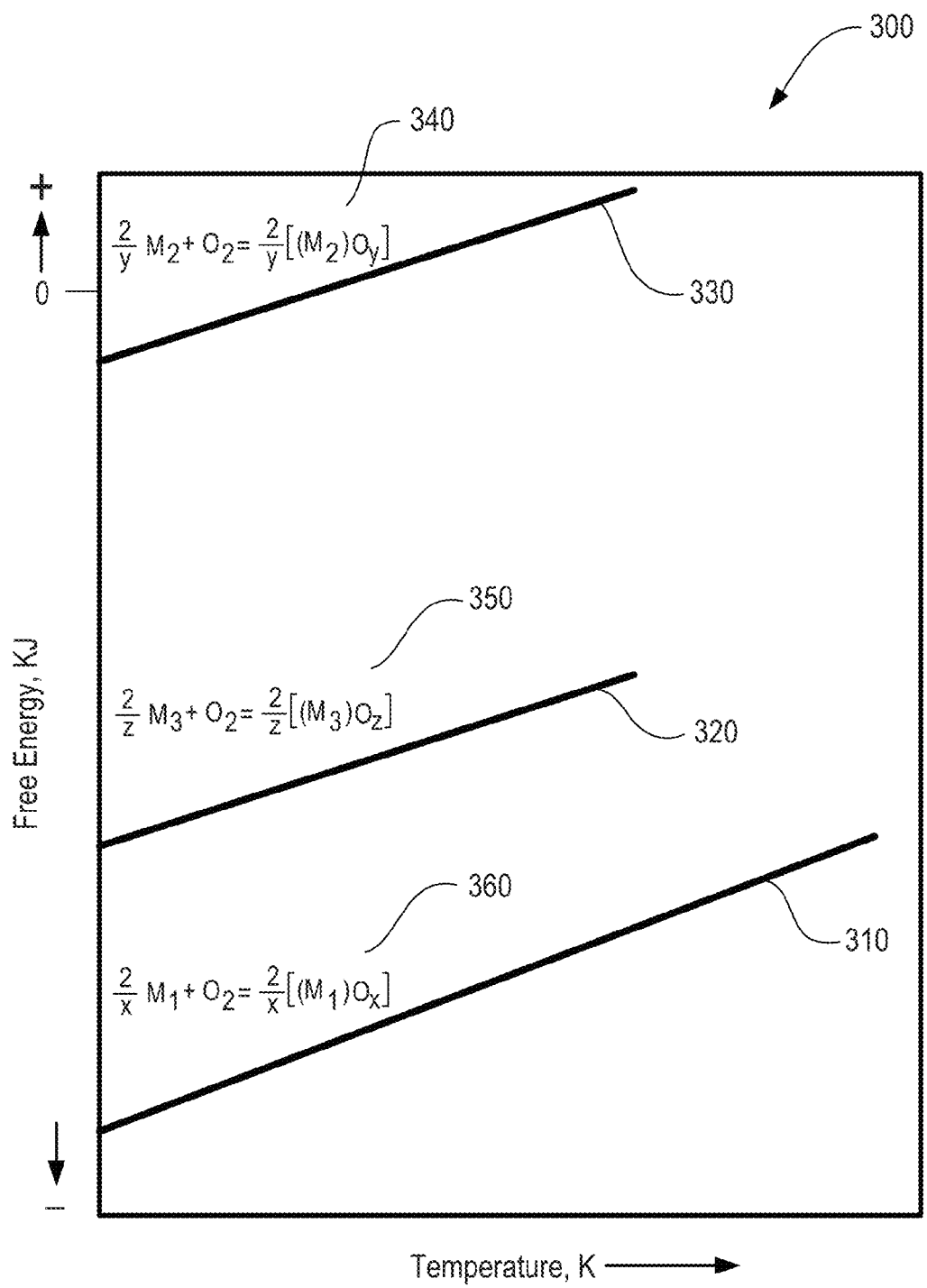
FIG. 3, on coordinates of free energy (kJ) and temperature (K), is a schematic Ellingham diagram depicting the change in standard free energy with respect to temperature for the formation of the oxide of the switching layer ($M1O_x$), the oxide of the electrode material ($M2O_y$) in the conductive alloy, and the oxide of the oxygen source ($M3O_z$), useful in constructing an example memristor in accordance with the teachings herein.

Reference is now made in detail to specific examples of the disclosed memristor including a dopant source and specific examples of ways for creating the disclosed memristor including a dopant source. When applicable, alternative examples are also briefly described.

As used herein, the singular forms "a," "an," and "the" include plural referents unless the context clearly dictates otherwise.

As used in this specification and the appended claims, "approximately" and "about" mean a ±10% variance caused by, for example, variations in manufacturing processes.

In the following detailed description, reference is made to the drawings accompanying this disclosure, which illustrate specific examples in which this disclosure may be practiced. The components of the examples can be positioned in a number of different orientations and any directional terminology used in relation to the orientation of the components is used for purposes of illustration and is in no way limiting. Directional terminology includes words such as "top," "bottom," "front," "back," "leading," "trailing," etc.

It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims.

Memristors are nano-scale devices that may be used as a component in a wide range of electronic circuits, such as memories, switches, and logic circuits and functions. When used as a basis for memories, the memristor may be used to store a bit of information, 1 or 0. When used as a logic circuit, the memristor may be employed as bits in a logic circuit that resembles a Field Programmable Gate Array, or may be the basis for a wired-logic Programmable Logic Array.

When used as a switch, the memristor may either be a closed or open switch in a cross-point memory. Throughout the last few years, researchers have made great progress improving the switching efficiency of these memristors. For example, tantalum oxide based memristors have demonstrated superior endurance over other nanoscale devices capable of electronic switching. In lab settings, tantalum oxide ($TaO_x$) based memristors have demonstrated 10 billion switching cycles whereas other memristors, such as tungsten oxide ($WO_x$) or titanium oxide ($TiO_x$) based memristors, require a sophisticated feedback mechanism for avoiding over-driving the devices or an additional step of refreshing the devices with stronger voltage pulses, in order to obtain an endurance in the range of 10 million switching cycles.

However, over time, both tantalum oxide based memristors and other similar oxide, nitride or sulfide based memristors encounter performance issues due to a loss of dopant in the switching region. A loss of dopant in the switching region, as further described below, may result in the memristor switching region becoming less resistive in the OFF state. Accordingly, this decrease in resistivity may result in the degradation of the ON/OFF resistance ratio of the memristor and hence, the degradation of the memristor's performance.

A new memristor structure is disclosed, including a dopant source incorporated into the switching electrode in the memristor, such that a dopant can be supplied from the switching electrode to the dopant depleted memristor switching region, restoring the balance of dopant to metal. Restoration of the dopant content in a memristor's switching region can restore the memristor's endurance and performance, measured by the memristor's ON/OFF resistance ratio. Additionally, formation of this new memristor structure is compatible with current fabrication processes.

FIG. 1A is a cross-sectional view of an example memristor without a dopant source in the OFF state. In the OFF state, the memristor 100a includes a first electrode 110, a switching layer 120 including a switching channel 140, and a second electrode 130. In the past, memristors including a switch have been studied in laboratory settings. (see, e.g. R. Stanley Williams, US Patent Publication 2008-0090337 A1, Apr. 17, 2008, the content of which is incorporated by reference herein in its entirety).

In some examples, the switching function of the memristor 100a may be achieved in the switching layer 120. In general, the switching layer 120 may be a weak ionic conductor that is semiconducting and/or insulating without dopants. These materials can be doped by native dopants, such as oxygen vacancies or impurity dopants (e.g. intentionally introducing different metal ions into the switching layer 120). The resulting doped materials may be electrically conductive because the dopants may be electrically charged and mobile under electric fields. Accordingly, the concentration profile of the dopants inside these materials (or the switching layer 120) can be reconfigured by electric fields, resulting in changes to the resistance of the device under electric fields, namely electrical switching.

In some examples, the switching layer 120 may include a transition metal oxide, such as tantalum oxide, yttrium oxide, hafnium oxide, zirconium oxide or other like oxides, or may include a metal oxide, such as aluminum oxide, calcium oxide, magnesium oxide or other like oxides. In one example, the switching layer 120 may include the oxide form of the metal of the first electrode 110. In alternate examples, the switching layer 120 may be formed of ternary oxides, quaternary oxides, or other complex oxides, such as strontium titanate oxide (STO) or praseodymium calcium manganese oxide (PCMO). In yet other examples, the switching layer 120 may include nitrides or sulfides.

An annealing process or other thermal forming process, such as heating by exposure to a high temperature environment, exposure to electrical resistance heating or other suitable processes, may be employed to form one or more switching channels 140, as these processes may cause localized atomic modification in the switching layer 120. In some examples, the conductivity of the switching channels 140 may be adjusted by applying different biases across the first electrode 110 and the second electrode 130. In other examples, the switching layers 120 may be singularly configurable.

In some examples, the memristor's switching layer 120 may consist of a single-layer, a bi-layer, or a multi-layer structure. In some examples, the switching layer 120 may have a bi-layer structure, including a thin insulating oxide layer and a thick, heavily reduced oxide layer. In one example, the insulating oxide layer is approximately 3 nm to 6 nm thick, and the reduced oxide layer is approximately 10 nm to 200 nm thick. In these examples, also known as forming-free memristors, no process for forming switching channels 140 is needed, since the oxide layer is so thin that there is no need to apply a high voltage or heat to form switching channels 140. The voltage applied during the normal operation of the switch is sufficient for forming a switching channel 140. In yet other examples, the switching layer is not a localized feature inside the memristor but is instead, a uniform feature inside the memristor. In these examples, the entire switching layer 120 can be viewed as a single uniform channel capable of switching.

In one example, the memristor may be switched OFF 100a and ON 100b when oxygen, other dopants or metal atoms move in the electric field, resulting in the reconfiguration of the switching channel 140 in the switching layer 120. Particularly, when the atoms move such that the formed switching channel 140 reaches from the first electrode 110 to the second electrode 130, the memristor is in the ON state 100b and has relatively low resistance to the voltage supplied between the first electrode 110 and the second electrode 130. Likewise, when the atoms move such that the formed switching channel 140 has a gap known as the switching region 150 between the first electrode 110 and the second electrode 130, the memristor is in the OFF state 100a and has a relatively high resistance to the voltage supplied between the first electrode 110 and the second electrode 130. In some examples, more than one switching channel 140 may be formed in the switching layer 120 upon heating.

The switching layer 120 may be between the first electrode 110 and the second electrode 130. In some examples, the first electrode 110 and the second electrode 130 may include any conventional electrode material. Examples of conventional electrode materials may include, but are not limited to, aluminum (Al), copper (Cu), gold (Au), molybdenum (Mo), niobium (Nb), palladium (Pd), platinum (Pt), ruthenium (Ru), ruthenium oxide ($RuO_2$), silver (Ag), tantalum (Ta), tantalum nitride (TaN), titanium nitride (TiN), tungsten (W) or tungsten nitride (WN).

FIG. 1B is a cross-sectional view of an example memristor without a dopant source in the ON state. The memristor in the ON state 100b contains substantially the same components as the memristor in the OFF state 100a as described in FIG. 1A. However, as described previously, when the memristor is in the ON state 100b, the switching channel 140 connects the first electrode 110 and the second electrode 130 such that no gap or switching region 150 is formed between the switching channel 140 and the second electrode 130.

Next, FIG. 2A is a cross-sectional view of an example memristor with an oxygen source in the OFF state, in accordance with the examples disclosed herein, and FIG. 2B is a cross-sectional view of an example memristor with an oxygen source in the ON state, also in accordance with the examples disclosed herein. Since both FIGS. 2A and 2B depict example oxide based memristors (or in other words, wherein the switching layer 120 includes an oxide), the dopant source used, as further described below, is an oxygen source.

In general, memristors with a dopant source 200a and 200b may contain similar components as memristors without a dopant source 100a and 100b, as described above. The memristor with a dopant source is able to achieve an OFF state 200a and an ON state 200b in the same manner as the memristor without a dopant source. However, instead of a second electrode 130, the memristor with a dopant source includes a conductive alloy 210, which may have desirable dopant solubility and may serve as a dopant source to the switching layer 120.

Accordingly, in the OFF state 200a, the example memristor with a dopant source generally includes an electrode 110, a switching layer 120 including a switching channel 140 and a switching region 150, and a conductive alloy 210. In some examples, the switching layer 120 may range from approximately 1 nm to 100 nm in thickness, the electrode 110 and the conductive alloy 130 may each be 100 nm or larger in thickness, and the switching region 150 may be 1 nm or smaller in thickness.

Like memristors without a dopant source 100a and 100b, in some examples, the electrode 110 may include any conventional electrode material (shown in FIGS. 2A and 2B as M1), such as aluminum (Al), copper (Cu), gold (Au), molybdenum (Mo), niobium (Nb), palladium (Pd), platinum (Pt), ruthenium (Ru), ruthenium oxide ($RuO_2$), silver (Ag), tantalum (Ta), tantalum nitride (TaN), titanium nitride (TiN), tungsten (W) or tungsten nitride (WN).

As discussed previously, one of the challenges in designing durable memristors that are capable of effective switching behavior is the degradation of the ON/OFF switching ratio over time due to decreasing dopant content in the switching layer 120 and more specifically impacted, the switching region 150. The decrease in dopant content in the switching region 150 may cause the switching region 150 to become more metallic, which may result in the OFF state 200a becoming less resistive over time. Accordingly, the resistance ratio between the ON state 200b and the OFF state 200a of the memristor may decrease over switching cycles, which may result in the memristor having a shorter working life.

In order to reverse this trend, dopant 220 may be supplied to the switching region 150 through the conductive alloy 210, which may include an electrode material (M2) and a dopant source material (M3) further including dopant 220. In some examples, the electrode material (M2) of the conductive alloy 210 may include any conventional electrode material, as described above, and may allow the conductive alloy 210 to be conductive.

In some examples wherein the memristor is an oxide based device (or when the switching layer 120 includes an oxide), the dopant source material (M3) in the conductive alloy 210 may store oxygen 220 for supply to the switching region 150. In this example, during the fabrication process, oxygen 220 may be dispersed into the dopant source material (M3) in the conductive alloy 210 for storage. Oxygen 220 may then move from the dopant source material (M3) to the switching region 150 or to the switching layer 120, generally, via thermodynamic and kinetic factors. In one example, the oxygen 220 may be transferred to the switching region 150 by chemical diffusion, caused by a difference in the oxygen chemical potential between the switching region 150 and the conductive alloy 210. As discussed previously, this movement of oxygen 220 into the switching region 150 may restore oxygen content in the switching region 150, thereby restoring the resistance ratio between the ON state 200b and the OFF state 200a of the memristor and restoring the performance of the memristor.

In some examples, the dopant source material (M3) may have three characteristics. In the example wherein the memristor is an oxide based device, the first characteristic is that the free energy of formation of the oxide of the dopant source material ($M3O_z$) may be more negative than the free energy of formation of the oxide of the electrode material in the conductive alloy 210 ($M2O_y$) but less negative than the free energy of formation of the switching oxide ($M1O_x$) in the switching layer 120. Alternatively, the first characteristic is met when the free energies are negative for both of the following two reactions:

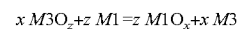

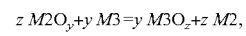

wherein "x", "y", and "z" represent any positive real number, M1 is the material of the electrode 110, M2 is the electrode material of the conductive alloy 210, and M3 is the dopant source material in the conductive alloy 210. Additionally, $M1O_x$, $M2O_y$, and $M3O_z$, are, respectively, the switching oxide in the switching layer 120, the oxide of the electrode material (M2) of the conductive alloy 210, and the oxide of the dopant source material (M3).

The presence of this first characteristic indicates that the oxide of dopant source material ($M3O_z$) is more stable than the oxide of the electrode material of the conductive alloy 210 ($M2O_y$), but less stable than the oxide in the switching layer 120 ($M1O_x$). Accordingly, oxygen 220 may only be transferred from the conductive alloy 210 to the switching region 150 and may not be transferred from the switching region 150 to the conductive alloy 210. Additionally, oxygen 220 may be preferentially drawn to the dopant source material (M3) instead of to the electrode material (M2) of the conductive alloy 210.

The second characteristic that the dopant source material (M3) may have is that oxygen 220 may be soluble in the dopant source material (M3). The presence of this second characteristic allows the dopant source material (M3) to store oxygen 220 such that the stored oxygen 220 may be tapped to replenish the diminishing oxygen in the switching region 150.

The third characteristic that the dopant source material (M3) may have is that the dopant source material (M3) may be soluble in the electrode material (M2) of the conductive alloy 210, examples of which are as described previously. This third characteristic allows the dopant source material (M3) to form a continuous single phase solid solution with or to have appreciable solubility in the electrode material (M2) of the conductive alloy 220. The ability of the dopant source material (M3) to form a continuous solid solution with or to have appreciable solubility in the electrode material (M2) of the conductive alloy 210 allows the distribution of oxygen 220 in the conductive alloy 210 to be uniform. If a single phase solid solution cannot be formed, the resulting conductive alloy 210 may be in two phases, which may prevent the oxygen 220 from diffusing into the local switching region 150.

It should be understood that although the foregoing memristors have been described and explained largely with reference to memristors including oxide based switching layers 120, the invention is not so limited. As described above, in some examples, the switching layer 120 may include a sulfide or a nitride instead of an oxide. In such examples, the memristor may function in substantially the same manner as the memristor including an oxide based switching layer 120. Additionally, the method for determining the appropriate materials for each memristor component may be substantially the same no matter whether the switching layer 120 is oxide, nitride, or sulfide based. The only difference is that the dopant source material (M3) may store nitrogen when a nitride based switching layer is used and may store sulfur when a sulfide based switching layer 120 is used. Accordingly, the methods for determining suitable materials for each memristor component may be adjusted to reflect use of nitrogen or sulfur as the dopant instead of oxygen. For example, if the switching layer 120 includes nitride, determination of a suitable dopant source material may depend on comparisons of the free energy of formation for various nitrides.

An Ellingham diagram of an example memristor, wherein the electrode 110 includes tantalum (Ta or M1), the switching layer 120 includes tantalum oxide (TaO$_x$ or M1O$_x$), and the conductive alloy 210 includes the electrode material platinum (Pt or M2), the dopant source material cobalt (Co or M3), and oxygen 220, may be used to explain the desired characteristics for the dopant source material (M3).

FIG. 3, on coordinates of free energy (kJ) and temperature (K), is an example schematic Ellingham diagram depicting the change in standard free energy with respect to temperature for the formation of TaO$_x$ (M1O$_x$) 310, PtO$_y$ (M2O$_y$) 330, and CoO$_z$ (M3O$_z$) 320. All the equations depicting change of free energy of formation are standardized to 1 mole of oxygen as seen in the equation 360 depicting change of free energy of formation of TaO$_x$ (M1O$_x$), the equation 340 depicting change of free energy of formation of PtO$_y$ (M2O$_y$), and the equation 350 depicting change of free energy of formation of CoO$_z$ (M3O$_z$).

In Ellingham diagrams, a more negative free energy of formation indicates the formation of a stronger bonded compound that may be more stable and may require more energy to break. As seen in FIG. 3, TaO$_x$(M1O$_x$) 310 is more stable than PtO$_y$ (M2O$_y$) 330 or CoO$_z$ (M3O$_z$) 320. Accordingly, in the memristor including Ta (M1) in the electrode 110 and switching layer 120, and Pt (M2), Co (M3), and oxygen in the conductive alloy 210, oxygen 220 may be released from the dopant source material, Co (M3), to the switching region 150 because the resulting formed oxide, TaO$_x$ (M1O$_x$), may be more stable.

In other words, first, Co may be a suitable dopant source material (M3) because the following reaction has a negative free energy: x CoO+Ta→TaO$_x$+x Co. The above reaction has a negative free energy because the free energy of formation of the oxide form of Co (M3), the dopant source material, is much less negative than the free energy of formation of TaO$_x$ (M1O$_x$), the switching oxide.

Second, Co may be a suitable dopant source material (M3) because oxygen may be soluble in Co. Additionally, from FIG. 3, because the change of free energy of formation for CoO$_z$ (M3O$_z$) is more negative than for PtO$_y$ (M2O$_y$), any oxygen in the conductive alloy 210 may be stored with Co (M3) as opposed to Pt (M2). As discussed previously, this arrangement may be present because of the stronger bond that can be formed between oxygen and Co (M3). Finally, third, Co may be capable of forming a continuous solid solution with the electrode material of the conductive alloy 210, Pt or M2, allowing for the uniform distribution of oxygen 220 in the conductive alloy 210.

In other examples, other materials may be suitable dopant source materials. In some examples, the material for the switching oxide (M1O$_x$) may be determined first. Next, the materials of the conductive alloy 210 may be chosen.

In some examples, the electrode material (M2) of the conductive alloy 210 may be more noble than the material (M1) of the electrode 110 or the dopant source material (M3). Accordingly, the free energy of formation of M2O$_y$ 330 may be less negative than the free energy of formations of M1O$_x$ 310 or M3O$_z$ 320. Additionally, in this example, the dopant source material (M3) may be less noble than the electrode material (M2) of the conductive alloy 210 but more noble that the material (M1) of the electrode 110.

In some examples, TaO$_x$ may be used as the switching oxide (M1O$_x$). In these examples, the electrode material (M2) of the conductive alloy 210 may include any conductive material, such as Ag, Au, Pd, Pt, Co, Cu, Mo or Ni. Next, in these examples, as described above, the dopant source material (M3) may be selected based on characteristics of the chosen conductive materials (M1 and M2). Some examples of compositions of the conductive alloy 210 may include silver for M2 and palladium for M3, gold for M2 and copper for M3, palladium for M2 and cobalt for M3, palladium for M2 and copper for M3, platinum for M2 and copper for M3, copper for M2 and nickel for M3, or molybdenum for M2 and chromium for M3.

Figure 4:
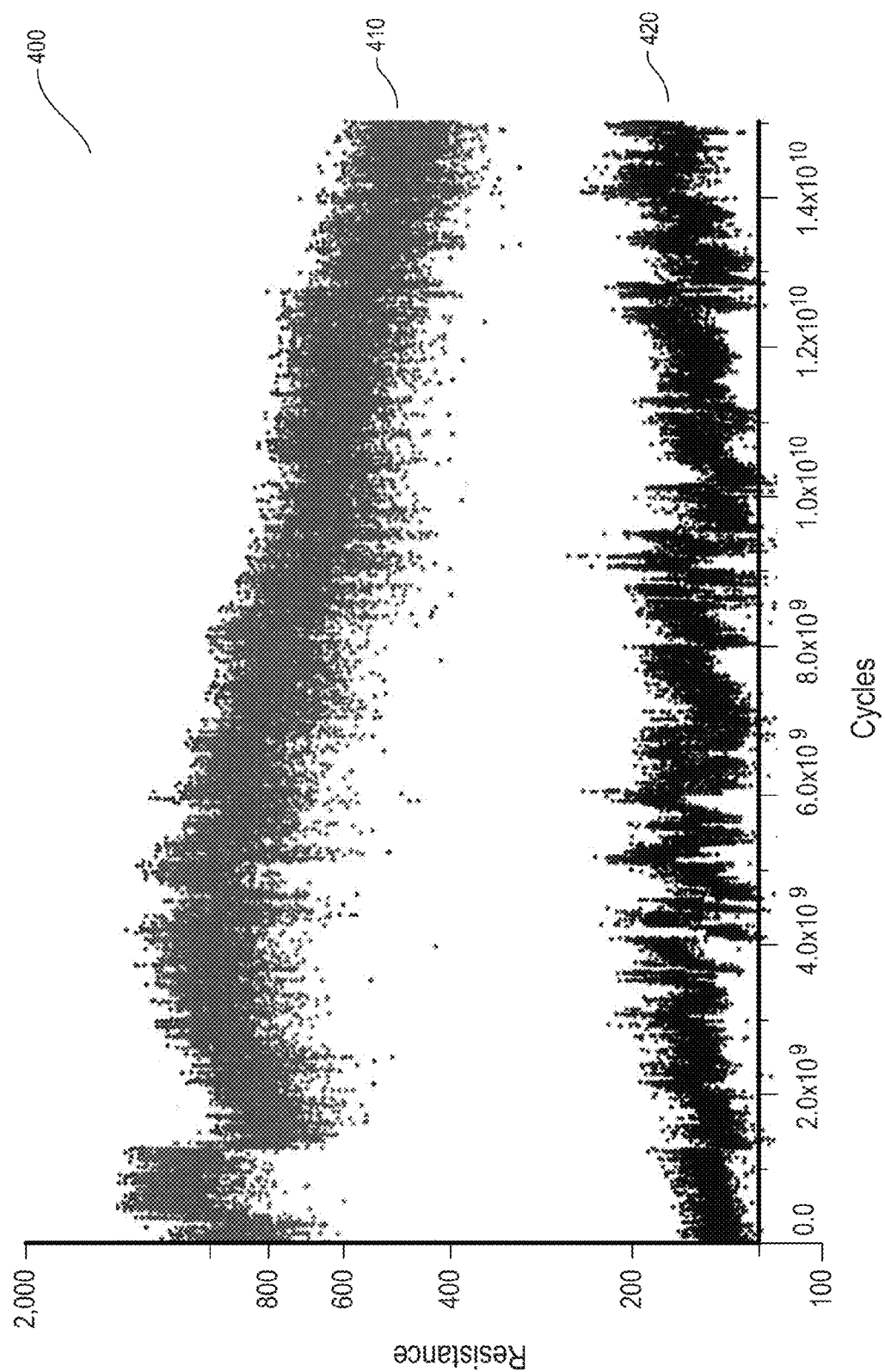
FIG. 4, on coordinates of resistance (ohm) and cycles, is a graph of a memristor endurance test depicting the resistance of a memristor including tantalum, tantalum oxide, and platinum in the ON state and the OFF state over 15 billion cycles.

FIG. 4, on coordinates of resistance (ohm) and cycles, is a graph of a memristor endurance test depicting the resistance of a memristor including tantalum, tantalum oxide, and platinum in the ON state and the OFF state over 15 billion cycles. In this graph 400, the upper data points 410 depict the resistance of the memristor in the OFF state, while the lower data points 420 depict the resistance of the memristor in the ON state.

The endurance was measured by using fixed negative and positive voltage pulses alternatively without a feedback loop. The resistance value of the device was interrogated by a small voltage sweep that does not perturb the device state after a certain number of switching pulses. As seen in the graph 400, as the memristor undergoes cycles, the resistance of the OFF state 410 decreases, lowering the effectiveness of the memristor and limiting its useful life. As discussed previously, the decreasing resistance of the OFF state 410 may be due to a loss of oxygen in the switching layer and eventually, may result in a degradation of the memristor's performance due to a decrease in the resistance ratio between the ON state and the OFF state.

Figure 5B:
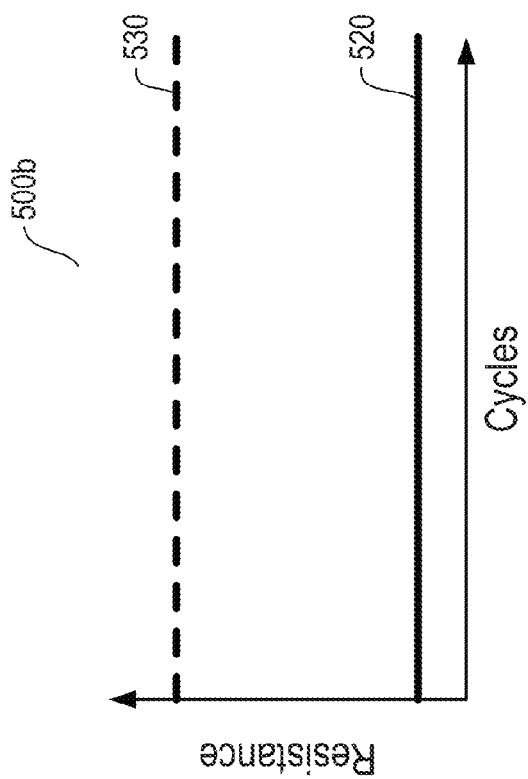
FIG. 5B, on coordinates of resistance (ohm) and cycles, is an example graph depicting the trend of a memristor's change in resistance over multiple ON-OFF cycles when an oxygen source is used.
Figure 5A:
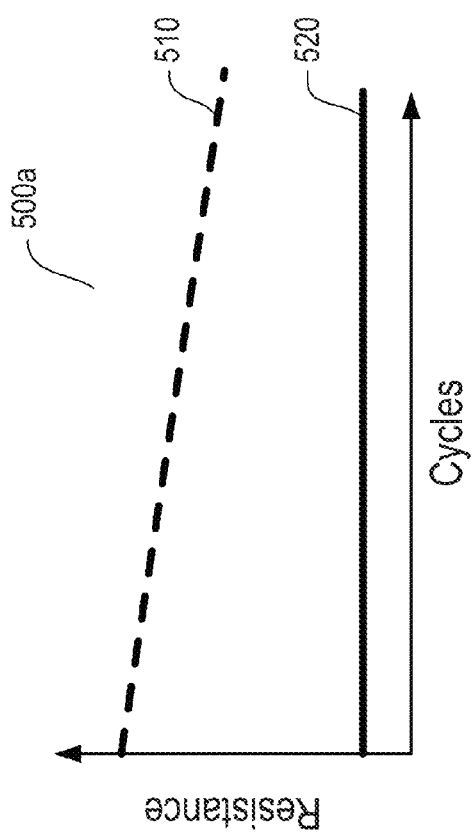
FIG. 5A, on coordinates of resistance (ohm) and cycles, is an example graph depicting the trend of a memristor's change in resistance over multiple ON-OFF cycles when no oxygen source is used.

FIG. 5A, on coordinates of resistance (ohm) and cycles, is a schematic graph depicting the trend of a memristor's change in resistance over multiple ON-OFF cycles when no oxygen source is used. In this example graph 500a, the upper trend line 510 depicts the resistance of the memristor in the OFF state, while the lower trend line 520 depicts the resistance of the memristor in the ON state. As seen in the example graph 500a, as the memristor undergoes ON-OFF cycles, the resistance of the memristor in the OFF state 510 decreases, indicating a degradation in the performance of the memristor.

On the other hand, FIG. 5B, on coordinates of resistance (ohm) and cycles, is a schematic graph depicting the trend of a memristor's change in resistance over multiple ON-OFF cycles when an oxygen source is used. In this example graph 500b, the upper trend line 530 depicts the resistance of the memristor in the OFF state, while the lower trend line 520 depicts the resistance of the memristor in the ON state. As seen in the example graph 500b, if oxygen 220 is supplied to the switching region 150, the resistance of the OFF state remains substantially constant 530 and the performance of the memristor does not degrade over switching cycles due to a loss of oxygen in the switching region 150 or the switching layer 120. Accordingly, when an oxygen source is provided to the memristor, the performance of the memristor may remain constant for a longer period of time than a memristor without an oxygen source.

Figure 6:
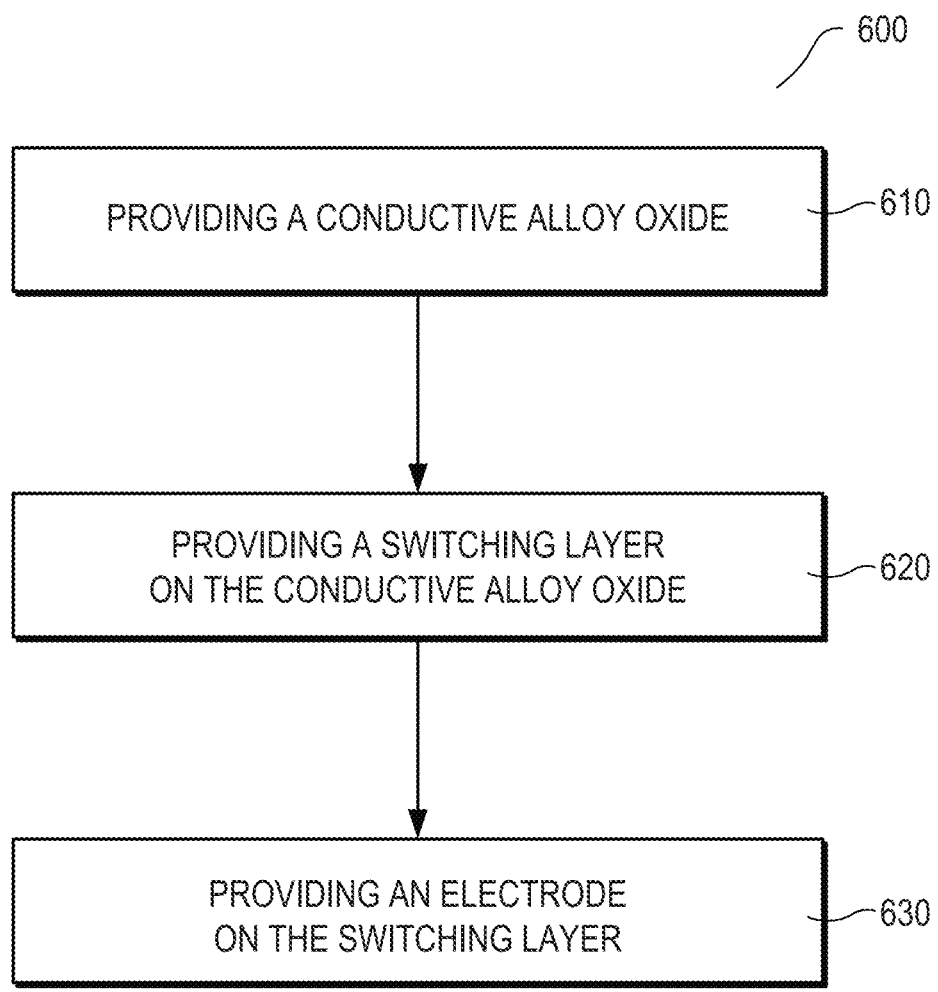
FIG. 6 is a flow chart depicting an example method for fabricating a memristor in accordance with the examples disclosed herein.

FIG. 6 is a flow chart depicting an example method 600 for fabricating a memristor in accordance with the examples disclosed herein. It should be understood that the method 600 depicted in FIG. 5 may include additional steps and that some of the steps described herein may be removed and/or modified without departing from the scope of the method 600.

First, the conductive alloy 210 may be formed 610. As discussed previously, the conductive alloy 210 includes a conventional electrode material (M2), a dopant source material (M3), and dopant 220. In some examples, dopant 220 can be dispersed into the dopant source material (M3) using a co-sputtering process. In this process two different sputtering targets may be used to simultaneously deposit two materials on the substrate (e.g. silicon wafer) at different deposition rates, depending on the final composition required. In one example of co-sputtering, the conductive alloy 210 may be formed by providing a conventional electrode material (M2) and a dopant source material (M3) as the two sputtering targets, in an environment including dopant 220. The presence of dopant 220 in the co-sputtering process may result in dopant 220 being provided to and stored in the dopant source material (M3). As discussed previously, the dopant 220 is more likely to be stored in the dopant source material (M3) rather than the conventional electrode material (M2), given the greater stability of the bond formed between dopant 220 and the dopant source material (M3). In other examples, dopant 220 may be dispersed in the dopant source material (M3) using thermal oxidation, reactive sputtering in an oxygen environment, chemical vapor deposition or other suitable processes. In yet other processes, the dopant source material (M3) including dopant 220 may be a naturally available or a commercially available compound.

Second, the switching layer 120 may be formed 620 on the conductive alloy 210. In one example, the switching layer 120 is an electronically semiconducting or nominally insulating and weak ionic conductor. The deposition of the switching layer 120 on the conductive alloy 210 may be achieved through sputtering, atomic layer deposition, chemical vapor deposition, evaporation, ion beam assisted deposition, anodization or other suitable processes.

Third, the electrode 110 may be formed 630 on the switching layer 120. The electrode 110 may be provided through any suitable formation process, such as chemical vapor deposition, sputtering, etching, lithography or other suitable processes. In some examples, more than one electrode may be provided. The deposition of the electrode 110 on the switching layer 120 may be achieved through sputtering, atomic layer deposition, chemical vapor deposition, thermal evaporation, electron beam evaporation, ion beam assisted deposition or other suitable processes. If more than one electrode is provided, the depositions of the additional electrodes on each other may be achieved through substantially the same processes.

In some examples, a switching channel 140 may be formed. In one example, the switching channel 140 is formed by heating the switching layer 120.

Heating can be accomplished using many different processes, including thermal annealing or running an electrical current through the memristor. In other examples, wherein a forming-free memristor with built-in conductance channels is used, no heating may be required as the switching channels 140 are built in and as discussed previously, the application of the first voltage, which may be approximately the same as the operating voltage, to the virgin state of the memristor may be sufficient for forming a switching channel 140.

While in the example described above, the conductive alloy 210 may be formed first, in other examples, the electrode 110 may be formed first. In such examples, the electrode 110 may be formed first, the switching layer 120 may be formed on the electrode second, and the conductive alloy 210 may be formed on the switching layer 120 third. In these examples, the layers are formed and layered in substantially the same way as described above.

It should be understood that the memristors described herein, such as the example memristors depicted in FIGS. 1A, 1B, 2A, and 2B may include additional components and that some of the components described herein may be removed and/or modified without departing from the scope of the memristor in such Figures. It should also be understood that the components depicted in these Figures are not drawn to scale and thus, the components may have different relative sizes with respect to each other than as shown therein. For example, the electrode 110 may be arranged substantially perpendicularly to the conductive alloy 220 or may be arranged at some other non-zero angle with respect to each other. As another example, the switching layer 120 may be relatively smaller or relatively larger than the electrode 110 or the conductive alloy 210.

What is claimed is:

1. A memristor including:
an electrode;
a conductive alloy including a conducting material, a dopant source material, and a dopant; and
a switching layer positioned between the electrode and the conductive alloy, wherein the switching layer includes an electronically semiconducting or nominally insulating and weak ionic switching material, wherein:
the dopant source material is soluble in the conducting material;
the dopant is soluble in the dopant source material; and
and the free energy of formation of a compound including the dopant and the material comprising the dopant source material is more negative than the free energy of formation of a compound including the dopant and the material comprising the conducting material and less negative that the free energy of formation of a compound including the dopant and the material comprising the electrode.

2. The memristor of claim 1, wherein the switching layer is a single layer structure, a bi-layer structure or a multi-layer structure.

3. The memristor of claim 1, wherein the switching layer or a part thereof is to form a switching channel.

4. The memristor of claim 1, wherein the electrode and the conducting material include a material selected from the group consisting of aluminum, copper, gold, molybdenum, niobium, palladium, platinum, ruthenium, ruthenium oxide, silver, tantalum, tantalum nitride, titanium nitride, tungsten, and tungsten nitride.

5. The memristor of claim 1, wherein:
the switching layer includes an oxide and the dopant is oxygen;
the switching layer includes a nitride and the dopant is nitrogen; or the switching layer includes a sulfide and the dopant is sulfur.

6. The memristor of claim 1, wherein:
the electrode includes tantalum, the switching material includes tantalum oxide, the conducting material includes platinum, and the dopant source material includes cobalt;
the electrode includes tantalum, the switching material includes tantalum oxide, the conducting material includes silver, and the dopant source material includes palladium;
the electrode includes tantalum, the switching material includes tantalum oxide, the conducting material includes gold, and the dopant source material includes copper;
the electrode includes tantalum, the switching material includes tantalum oxide, the conducting material includes palladium, and the dopant source material includes cobalt;
the electrode includes tantalum, the switching material includes tantalum oxide, the conducting material includes palladium, and the dopant source material includes copper;
the electrode includes tantalum, the switching material includes tantalum oxide, the conducting material includes platinum and the dopant source material includes copper;
the electrode includes tantalum, the switching material includes tantalum oxide, the conducting material includes copper, and the dopant source material includes nickel; or the electrode includes tantalum, the switching material includes tantalum oxide, the conducting material includes molybdenum, and the dopant source material includes chromium.

7. A method for fabricating the memristor of claim 1, the method including:
providing either the conductive alloy or the electrode as a first layer;
providing the switching layer on the first layer;
providing either the conductive alloy or the electrode on the switching layer;
dispersing the dopant into the dopant source material; and
dispersing the dopant source material into the conducting material.

8. The method of claim 7, wherein the electrode and the conducting material include a material selected from the group consisting of aluminum, copper, gold, molybdenum, niobium, palladium, platinum, ruthenium, ruthenium oxide, silver, tantalum, tantalum nitride, titanium nitride, tungsten, and tungsten nitride.

9. The method of claim 7, wherein:
the switching layer includes an oxide and the dopant is oxygen;
the switching layer includes a nitride and the dopant is nitrogen; or
the switching layer includes a sulfide and the dopant is sulfur.

10. The method of claim 7, wherein the dopant source material is soluble in the conducting material, the dopant is soluble in the dopant source material, and the free energy of formation of a compound including the dopant and the material comprising the dopant source material is more negative than the free energy of formation of a compound including the dopant and the material comprising the conducting material and less negative that the free energy of formation of a compound including the dopant and the material comprising the electrode.

11. The method of claim 7, further including forming a switching channel.

12. The method of claim 7 further including forming the dopant source material by chemical vapor deposition, atomic layer deposition, reactive-sputtering or thermal diffusion.

13. The method of claim 12 further including forming the dopant source material in an environment including the dopant.

14. A memristor, including:
an electrode;
a conductive alloy including a conducting material, a dopant source material dispersed in the conducting material, and a dopant dispersed in the dopant source material; and
a switching layer positioned between the electrode and the conductive alloy, wherein the switching layer includes an electronically semiconducting or nominally insulating and weak ionic switching material.

15. The memristor of claim 14, wherein the switching layer is a single layer structure, a bi-layer structure or a multi-layer structure.

16. The memristor of claim 14, wherein the switching layer or a part thereof is to form a switching channel.

17. The memristor of claim 14, wherein the electrode and the conducting material include a material selected from the group consisting of aluminum, copper, gold, molybdenum, niobium, palladium, platinum, ruthenium, ruthenium oxide, silver, tantalum, tantalum nitride, titanium nitride, tungsten, and tungsten nitride.

18. The memristor of claim 14, wherein:
the switching layer includes an oxide and the dopant is oxygen;
the switching layer includes a nitride and the dopant is nitrogen; or
the switching layer includes a sulfide and the dopant is sulfur.

19. The memristor of claim 14, wherein the dopant source material is soluble in the conducting material, the dopant is soluble in the dopant source material, and the free energy of formation of a compound including the dopant and the material comprising the dopant source material is more negative than the free energy of formation of a compound including the dopant and the material comprising the conducting material and less negative that the free energy of formation of a compound including the dopant and the material comprising the electrode.

20. The memristor of claim 19, wherein:
the electrode includes tantalum, the switching material includes tantalum oxide, the conducting material includes platinum, and the dopant source material includes cobalt;
the electrode includes tantalum, the switching material includes tantalum oxide, the conducting material includes silver, and the dopant source material includes palladium;
the electrode includes tantalum, the switching material includes tantalum oxide, the conducting material includes gold, and the dopant source material includes copper;
the electrode includes tantalum, the switching material includes tantalum oxide, the conducting material includes palladium, and the dopant source material includes cobalt;
the electrode includes tantalum, the switching material includes tantalum oxide, the conducting material includes palladium, and the dopant source material includes copper;

the electrode includes tantalum, the switching material includes tantalum oxide, the conducting material includes platinum and the dopant source material includes copper;

the electrode includes tantalum, the switching material includes tantalum oxide, the conducting material includes copper, and the dopant source material includes nickel; or the electrode includes tantalum, the switching material includes tantalum oxide, the conducting material includes molybdenum, and the dopant source material includes chromium.

\* \* \* \* \*

UNITED STATES PATENT AND TRADEMARK OFFICE
CERTIFICATE OF CORRECTION

PATENT NO. : 9,178,153 B2  
APPLICATION NO. : 14/233075  
DATED : November 3, 2015  
INVENTOR(S) : Minxian Max Zhang et al.

Page 1 of 1

It is certified that error appears in the above-identified patent and that said Letters Patent is hereby corrected as shown below:

In the claims,

In column 10, lines 43-44, in Claim 1, delete "and and" and insert -- and --, therefor.

Signed and Sealed this  
Twenty-second Day of March, 2016

Michelle K. Lee  
*Director of the United States Patent and Trademark Office*